(12) United States Patent
Hasunuma

(10) Patent No.: US 8,378,499 B2
(45) Date of Patent: Feb. 19, 2013

(54) SEMICONDUCTOR STORAGE DEVICE

(75) Inventor: Eiji Hasunuma, Chuo-ku (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 13/311,720

(22) Filed: Dec. 6, 2011

(65) Prior Publication Data

US 2012/0132972 A1 May 31, 2012

Related U.S. Application Data

(63) Continuation of application No. 11/686,885, filed on Mar. 15, 2007, now Pat. No. 8,093,724.

(30) Foreign Application Priority Data

Apr. 13, 2006 (JP) .................................. 2006-111009

(51) Int. Cl.
*H01L 29/40* (2006.01)
(52) U.S. Cl. .......................... 257/774; 257/758; 257/773
(58) Field of Classification Search .................. 257/773, 257/774, 758
See application file for complete search history.

(56) References Cited

U.S. PATENT DOCUMENTS

| 2003/0235946 A1* | 12/2003 | Lee et al. ....................... 438/243 |
| 2004/0004257 A1* | 1/2004 | Lee et al. ....................... 257/390 |
| 2006/0211192 A1* | 9/2006 | Cho et al. ....................... 438/238 |

FOREIGN PATENT DOCUMENTS

| CN | 1495906 A | 5/2004 |
| JP | 2004-080009 A | 3/2004 |
| KR | 20040098691 A | 11/2004 |

* cited by examiner

*Primary Examiner* — Bradley K Smith
(74) *Attorney, Agent, or Firm* — Sughrue Mion, PLLC

(57) ABSTRACT

A semiconductor storage device with active regions formed in the shape of a band in a substrate; a plurality of word lines arranged at equal intervals that intersect the active regions; cell contacts that includes first cell contacts in the active regions in the center portions in a longitudinal direction, and second cell contacts at both ends in the longitudinal direction; bit line contacts on the first cell contacts; bit lines that pass over the bit line contacts; storage node contacts on the second cell contacts; storage node contact pads on the storage node contacts; and storage capacitors on the storage node contact pads. The center positions of the storage node contacts are offset from the center positions of the second cell contacts. The center positions of the storage node contact pads are offset from the center positions of the storage node contacts.

22 Claims, 24 Drawing Sheets

SEMICONDUCTOR STORAGE DEVICE

This application is a Continuation of application Ser. No. 11/686,885 filed Mar. 15, 2007, which is based on Japanese Patent Application No. 2006-111009 filed on Apr. 13, 2006, the disclosure of which is incorporated herein by reference in its entirety.

TECHNICAL FIELD

The present invention relates to a semiconductor storage device, and particularly relates to a DRAM (Dynamic Random Access Memory) memory cell layout.

BACKGROUND OF THE INVENTION

In DRAM, which is one type of semiconductor storage device, a memory cell composed of a single transistor and a single capacitor is disposed at the intersection of a word line and a bit line that intersect with each other. Layout systems in DRAM memory cells are classified as folded bit line systems and open bit line systems (see Japanese Laid-open Patent Application No. 2004-80009). In a folded bit line system, two bit lines that are connected to a single sense amplifier are folded at the sense amplifier so as to be wired in the same direction, and the minimum theoretical area of the memory cell is $8F^2$ ($4F \times 2F$), wherein "F" is the minimum feature size (half the pitch of the word lines). In an open bit line system, two bit lines that are connected to a single sense amplifier are wired so as to extend in opposite directions on the sides of the sense amplifier, and the minimum theoretical area of the memory cell is $6F^2$ ($2F \times 3F$).

FIG. 23A through 23F shows an example of the layout of conventional DRAM having a cell area of $6F^2$. A plurality of active regions 13 is formed symmetrically about a line (FIG. 23A), and word lines 14 are wired in the Y direction at intervals of 1F (FIG. 23B). Cell contacts 18 are formed in the center portions and end portions of the active regions 13 (FIG. 23C). Bit line contacts (not shown) are formed directly above the cell contacts 18 of the central portions, and bit lines are wired so as to extend in the X direction in meandering fashion over the bit line contacts so as to avoid the cell contacts 18 of the end portions (FIG. 23D). Storage node contacts 24 are formed above the cell contacts 18 disposed at the end portions of the active regions 13 (FIG. 23E). The center positions of the storage node contacts 24 are offset from the center positions of the cell contacts 18, whereby the storage node contacts 24 are arranged at equal intervals in the X direction. Storage capacitors 28 are also formed directly above the storage node contacts 24 (FIG. 23F).

Japanese Laid-open Patent Application No. 2004-80009 discloses a structure of an integrated circuit memory element in which a landing pad is formed between a contact plug and a storage capacitor. This integrated circuit memory element comprises an interlayer insulating film that is formed on a substrate and has numerous storage node contact holes arranged linearly in one direction; storage node contacts that are embedded in the storage node contact holes; an insulating film that is formed on an interlayer insulating film and has numerous landing pad holes that are arranged nonlinearly in one direction and that expose the storage node contacts; landing pads that are embedded in the landing pad holes and connected to the storage node contacts; and storage capacitors connected to the landing pads. In this structure, since landing pads are formed between the contact plugs and the storage capacitors, the storage capacitors can be arranged in a zigzag pattern in a plane even when the contact plugs are aligned in the transverse and longitudinal directions of the plane.

The layout of conventional DRAM having the memory cell area of $6F^2$ shown in FIGS. 23A through 23F has a region in which the storage capacitors are not arranged in zigzag fashion on the plane, and the storage capacitors cannot be placed in a perfectly zigzag arrangement. Therefore, the storage capacitors cannot be packed at maximum density.

In the structure disclosed in Japanese Laid-open Patent Application No. 2004-80009, when the contact plugs are aligned in the transverse and longitudinal directions on a plane, the storage capacitors can be arranged in zigzag fashion and packed at maximum density merely by being arranged in zigzag fashion so as to be offset from each other. However, in such a case as when the contact plugs are originally arranged in zigzag fashion in the transverse and longitudinal directions, it is difficult to pack the storage capacitors at maximum density. Since the elliptical storage capacitors have an inadequate diameter in the minor axis direction, it is impossible to increase the capacity of the capacitors. Furthermore, when the lower electrode of an MIS (Metal Insulator Silicon) capacitor is composed of HSG-Si (Hemi-Spherical Grained poly-Si), the HSG blockage margin cannot be adequately ensured, and the cylinder holes used by the storage capacitors become blocked with HSG-Si.

SUMMARY OF THE INVENTION

It is therefore an object of the present invention to provide a semiconductor storage device in which the storage capacitors can be arranged with maximum density in a $6F^2$ layout, and the HSG blockage margin can be adequately ensured.

The above and other objects of the present invention can be accomplished by a semiconductor storage device comprising a semiconductor substrate; a plurality of active regions formed in the shape of a band in the semiconductor substrate; a plurality of word lines arranged at equal intervals so as to intersect the active regions; a plurality of cell contacts that includes first cell contacts formed in the active regions in the center portions in the longitudinal direction thereof, and second cell contacts formed at each end portion at both ends in the longitudinal direction; bit line contacts formed on the first cell contacts; bit lines wired so as to pass over the bit line contacts; storage node contacts formed on the second cell contacts; storage node contact pads formed on the storage node contacts; and storage capacitors formed on the storage node contact pads, wherein the center positions of the storage node contacts are offset in a prescribed direction from the center positions of the second cell contacts, and the center positions of the storage node contact pads are offset in a prescribed direction from the center positions of the storage node contacts.

According to the present invention, it is possible to arrange the storage capacitors at high density and adequately ensure the HSG blockage margin in a DRAM or other semiconductor storage device that has a $6F^2$ cell layout.

In the present invention, the plurality of active regions is preferably aligned with a straight line that forms a prescribed angle with the X direction intersecting the word lines, and is aligned with the Y direction parallel to the word lines, and the prescribed angle is preferably approximately 18 degrees. When the active regions are aligned with a straight line that is angled approximately 18 degrees from the X direction, the distance between the center positions of two cell contacts can be set to 4F in the X direction and 4/3F in the Y direction, and the optimum cell contact layout can be achieved in a $6F^2$ layout when the cell contacts are formed at both end portions of the active regions.

In the present invention, the center positions of the storage node contacts are preferably offset toward the corresponding bit line contacts in relation to the center positions of the second cell contacts, and are preferably offset so as to be at equal intervals in the X direction in relation to the center positions of the second cell contacts. All of the storage node contact pads can thereby be offset by the same amount, and it is easy to ultimately create a high-precision, high-density layout of the storage capacitors when the storage node contact pads are laid out at maximum density.

In the present invention, a first pad layout in which the positions of the storage node contact pads are offset in the direction towards the center portions of the corresponding active regions, and a second pad layout in which the positions of the storage node contact pads are offset in the direction away from the center portions of the corresponding active regions are preferably employed in alternating fashion for the plurality of active regions arranged in the Y direction. The first and second pad layouts are also preferably employed in alternating fashion for the plurality of active regions arranged on the straight line. In this case, the amount of offset of the storage node contact pads is preferably ¾F in the X direction and ⅓F in the Y direction. Offsetting the storage node contact pads in the manner described above makes it possible to arrange the storage node contact pads in a uniform zigzag pattern, and to easily achieve a high-precision, high-density layout of the storage capacitors.

BRIEF DESCRIPTION OF THE DRAWINGS

The above and other objects, features and advantages of this invention will become more apparent by reference to the following detailed description of the invention taken in conjunction with the accompanying drawings, wherein.

DESCRIPTION OF THE PREFERRED EMBODIMENTS

Preferred embodiments of the present invention will now be described in detail hereinafter with reference to the accompanying drawings.

FIGS. 1 through 9 are schematic plan views showing the layout in the sequence of the manufacturing process of the DRAM 10 as an embodiment of the semiconductor storage device of the present invention. FIGS. 10 through 18 are schematic sectional views along line P-P in FIGS. 1 through 9, respectively.

Figure 1:
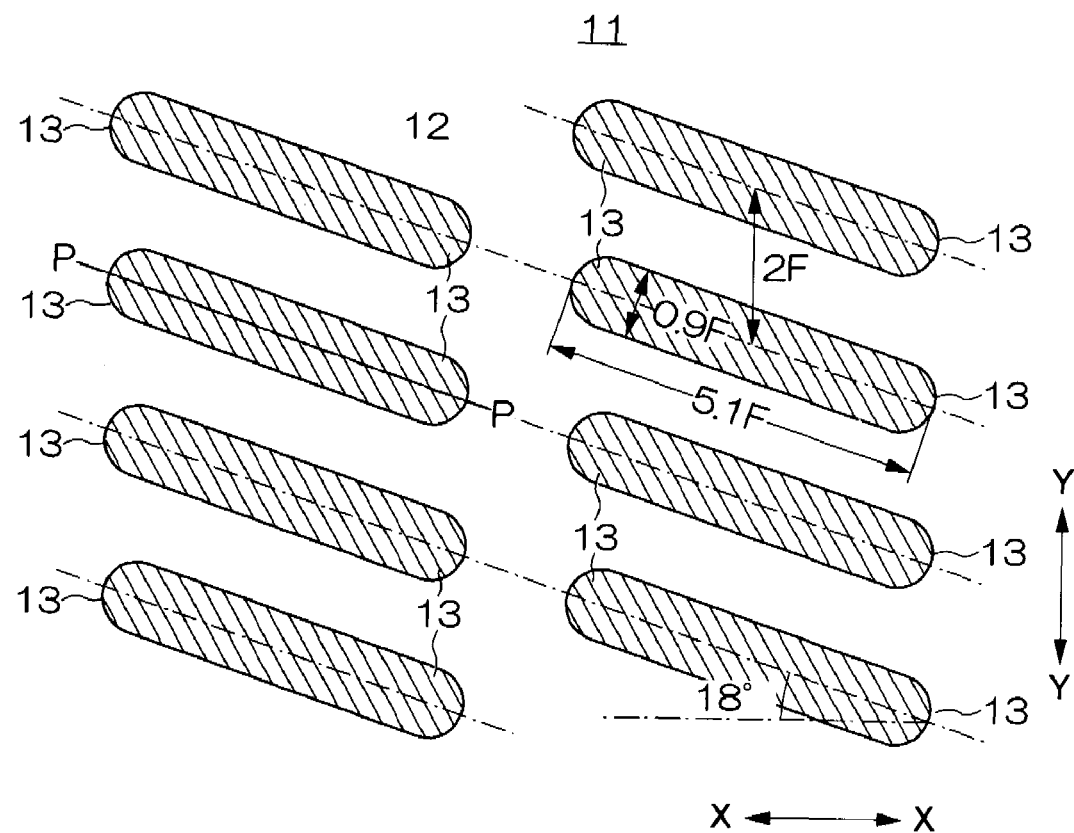
FIG. 1 is a schematic plan view showing the layout in the sequence of the manufacturing process of the DRAM 10 (specifically forming active regions 13) according to a preferred embodiment of the present invention.
Figure 10:
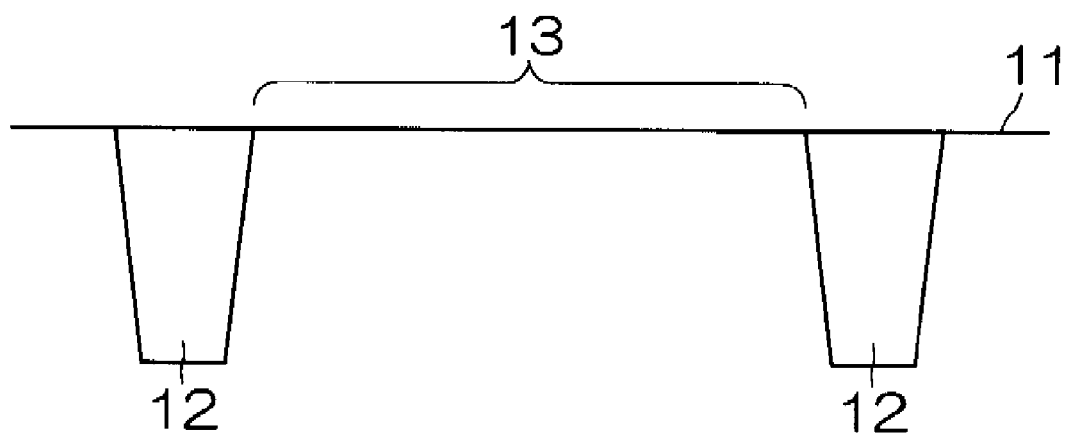
FIG. 10 is a schematic sectional view along line P-P in FIG. 1.

In the manufacture of the semiconductor storage device 10, a field oxide film (element separation region) is first formed by STI (Shallow Trench Isolation) or another method on a silicon substrate 11 as shown in FIGS. 1 and 10, whereby a plurality of active regions 13 is formed. The active regions 13 are substantially band-shaped regions having a prescribed length, and the plurality of active regions 13 is formed in a straight line in the longitudinal direction thereof. The longitudinal direction of the active regions 13 is angled approximately 18 degrees from the X direction, wherein the X direction is the direction orthogonal to the wiring direction of the word lines described hereinafter. When the active regions are aligned with a straight line that is at an angle of approximately 18 degrees from the X direction, the X direction component of the distance between the center positions of two cell contacts formed at end portions on both ends of the active regions can be set to 4F, and the Y direction component can be set to 4/3F in the formation of the cell contacts described hereinafter. The optimum cell contact layout can therefore be achieved in a 6F$^2$ layout. When the wiring direction of the word lines is the Y direction, the active regions 13 are arranged at equal intervals in the Y direction. The width of the active regions 13 is about 1F (wherein F is the minimum feature size), and the length is about 5.1F. The distance between the centers of active regions 13 that are adjacent in the Y direction is set to 2F.

Figure 2:
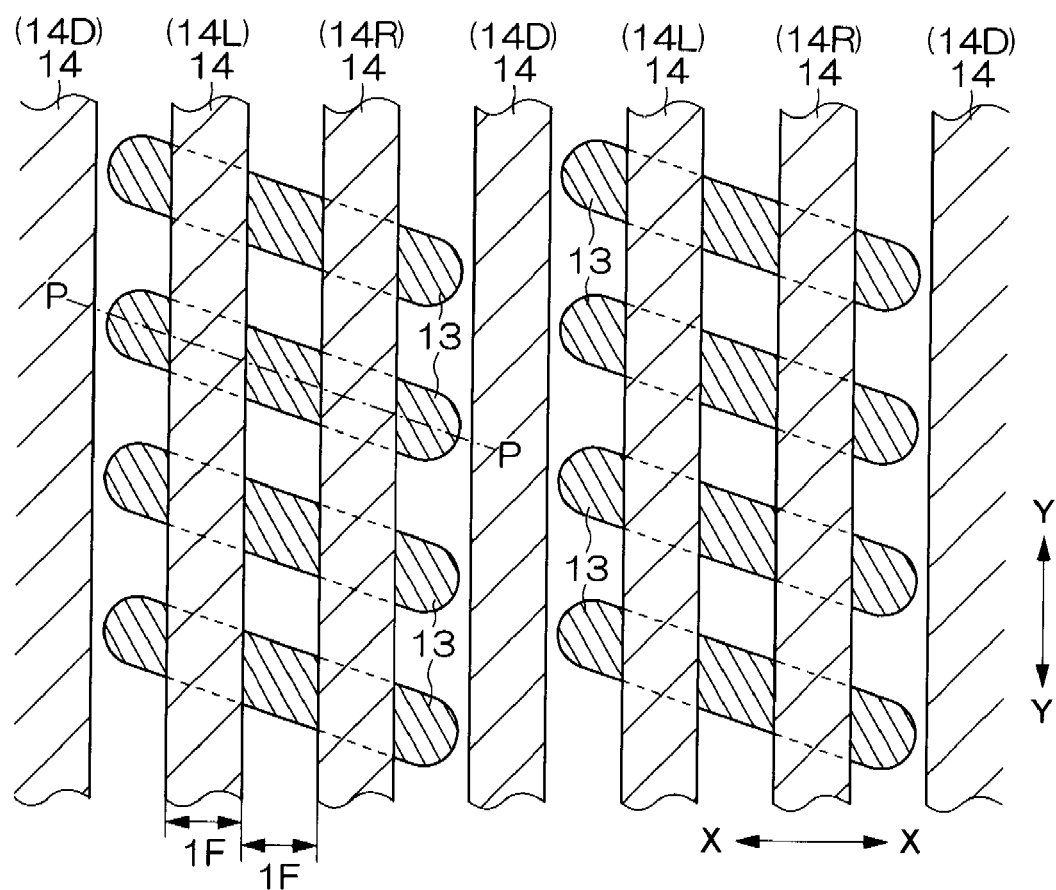
FIG. 2 is a schematic plan view showing the layout in the sequence of the manufacturing process of the DRAM 10 (specifically forming word lines 14) according to a preferred embodiment of the present invention.
Figure 11:
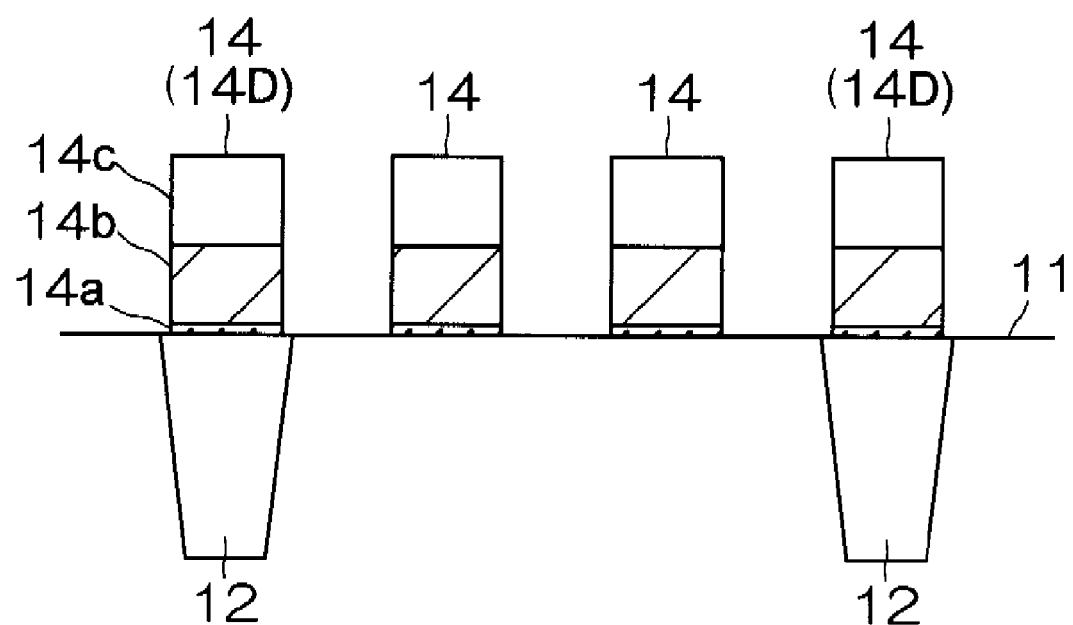
FIG. 11 is a schematic sectional view along line P-P in FIG. 2.

As shown in FIGS. 2 and 11, a plurality of word lines 14 is then formed on the silicon substrate 11 in which the active regions 13 are formed. The word lines are wired in the Y direction, and the width of the word lines 14 and the space between adjacent word lines 14, 14 are both set to 1F. Two word lines 14L, 14R intersect in a single active region 13. One word line 14L passes between the center portion and one end portion of the active region 13, and the other word line 14R passes between the center portion and the other end portion of the active region 13. One of three word lines 14 does not intersect with the active region 13, and is a dummy word line 14D that does not actually function as a word line. In the formation of the word lines 14, gate oxide films 14a are first formed on the entire surface of the active region 13, after which conducting films 14b formed by layering a polysilicon film, a tungsten silicide film, a tungsten nitride film, and a tungsten film in sequence are formed on the gate oxide films 14a, and gate cap insulating films 14c composed of silicon nitride are then formed. The word lines 14 are then formed by patterning the multilayer film in linear fashion.

Figure 3:
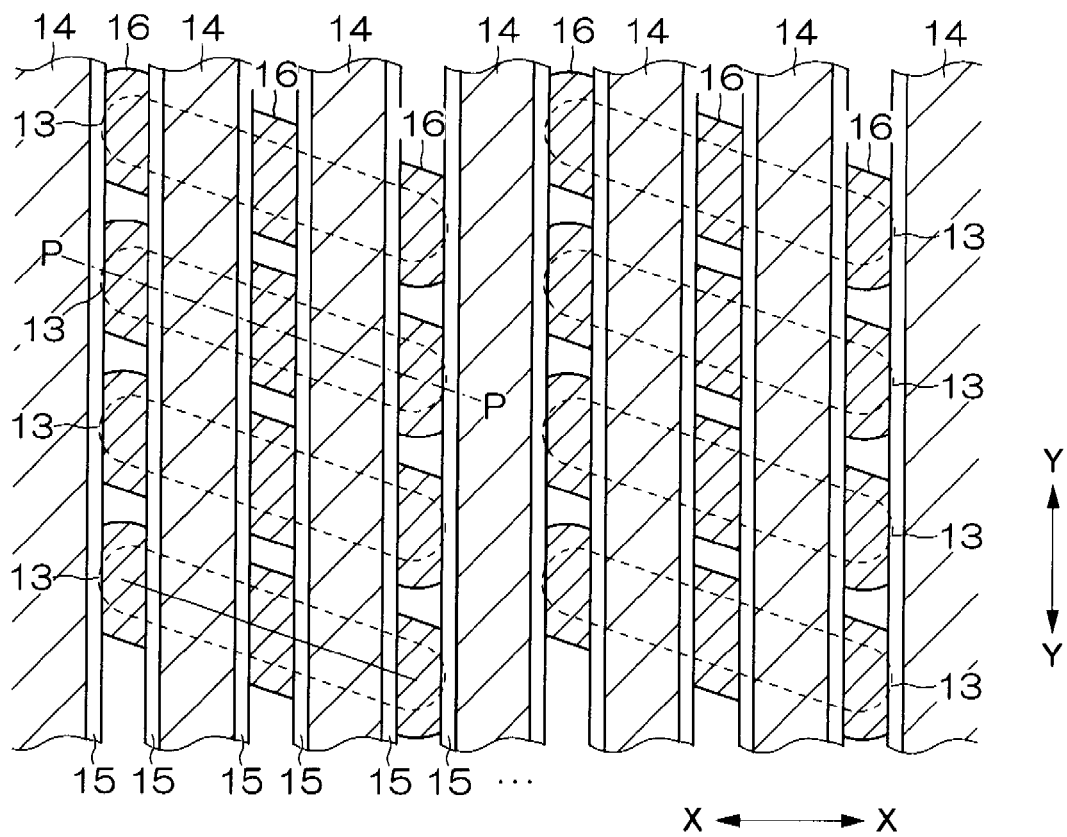
FIG. 3 is a schematic plan view showing the layout in the sequence of the manufacturing process of the DRAM 10 (specifically forming side walls 15 and silicon epitaxial layers 16) according to a preferred embodiment of the present invention.
Figure 12:
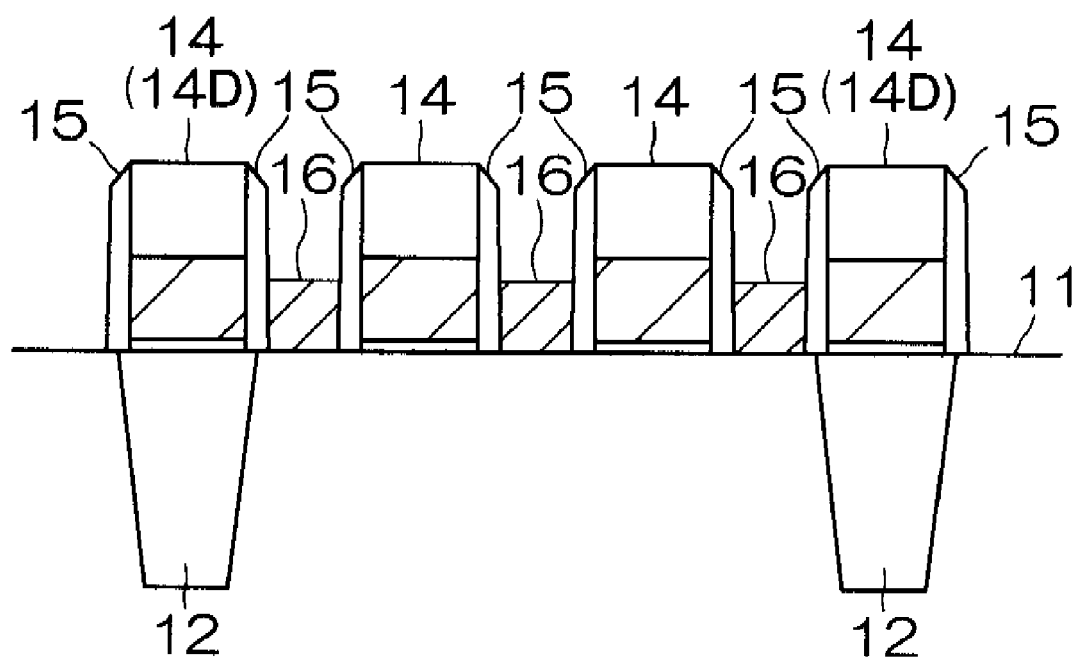
FIG. 12 is a schematic sectional view along line P-P in FIG. 3.

As shown in FIGS. 3 and 12, side walls 15 are then formed on both sides of the word lines 14, and silicon epitaxial layers 16 are formed in the exposed portions of the active regions 13. The side walls 15 are formed by a process in which a silicon nitride film having a thickness of about 26 nm is formed on the entire surface of the substrate, and the silicon nitride film is then etched back. The end portions and the center portions of the active regions 13, which are the exposed portions, are then grown epitaxially, and the silicon epitaxial layers 16 are formed. The width of the silicon epitaxial layers 16 is preferably about 60 nm, the width thereof in the Y direction is preferably about 168 nm, and the separation margin between silicon epitaxial layers 16, 16 that are adjacent in the Y direction is preferably about 30 nm.

Figure 4:
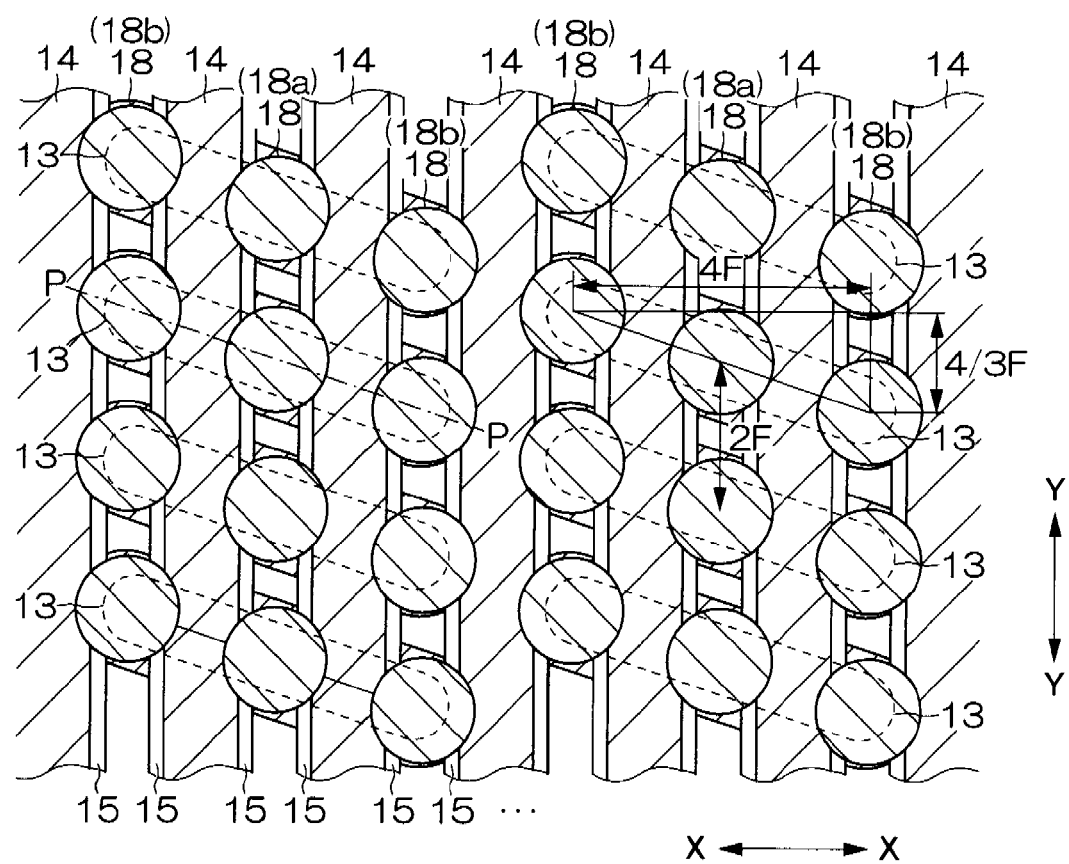
FIG. 4 is a schematic plan view showing the layout in the sequence of the manufacturing process of the DRAM 10 (specifically forming cell contacts 18) according to a preferred embodiment of the present invention.
Figure 13:
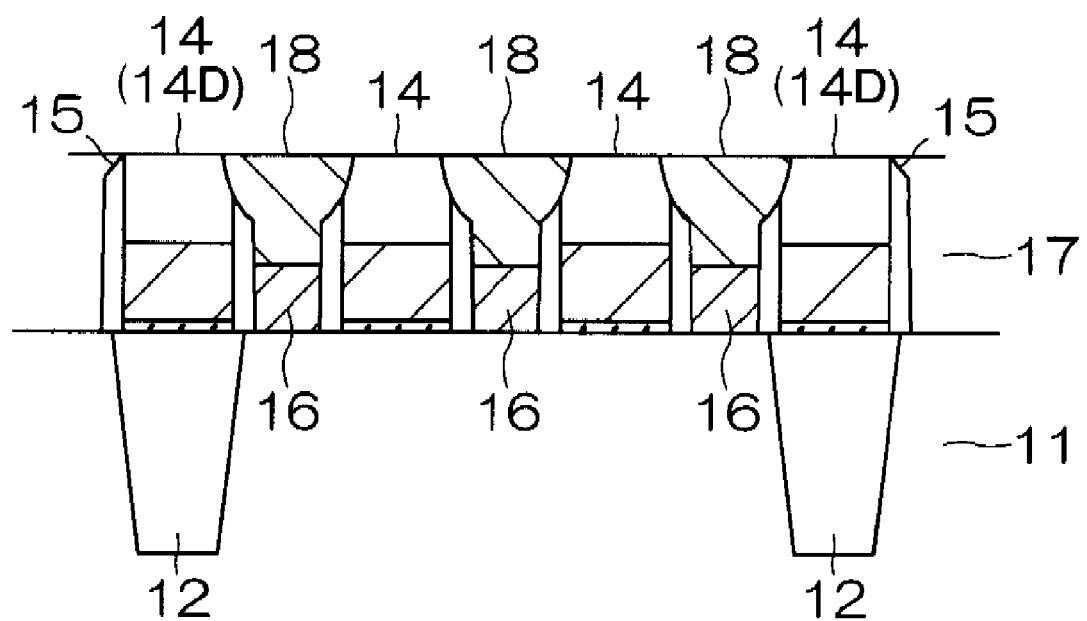
FIG. 13 is a schematic sectional view along line P-P in FIG. 4.

As shown in FIGS. 4 and 13, cell contacts 18 are formed above the center portions and the portions at both ends of the active regions 13. The cell contacts 18 are formed by a process in which an interlayer insulating film 17 composed of BPSG (Boro-Phospho Silicate Glass) having a prescribed thickness is formed on the entire surface of the substrate, contact holes that pass through the interlayer insulating film 17 are formed in the center portions and the portions at both ends of the active regions 13, and DOPOS (Doped Poly-Silicon) or another conductive material is filled into the contact holes. The contact holes are formed by photolithography and etching using a resist mask. The cell contacts 18 are formed by a process in which DOPOS is deposited on the entire surface of the substrate, including the interior of the contact holes, and the DOPOS is then polished by CMP so as to remain only in the interior of the contact holes.

The X direction component of the distance between the center portions of the cell contacts 18b, 18b formed at the portions at both ends of the active regions 13 is set to 4F, and the Y direction component is set to 4/3F. The cell contacts 18a formed in the center portions of the active regions 13 are provided in the middle position between the cell contacts 18b, 18b of the portions at both ends. The distance between the centers of cell contacts 18, 18 that are adjacent in the Y direction is 2F. The top diameter of the cell contacts 18 is preferably about 140 nm, and the bottom diameter is preferably about 93 nm.

Figure 5:
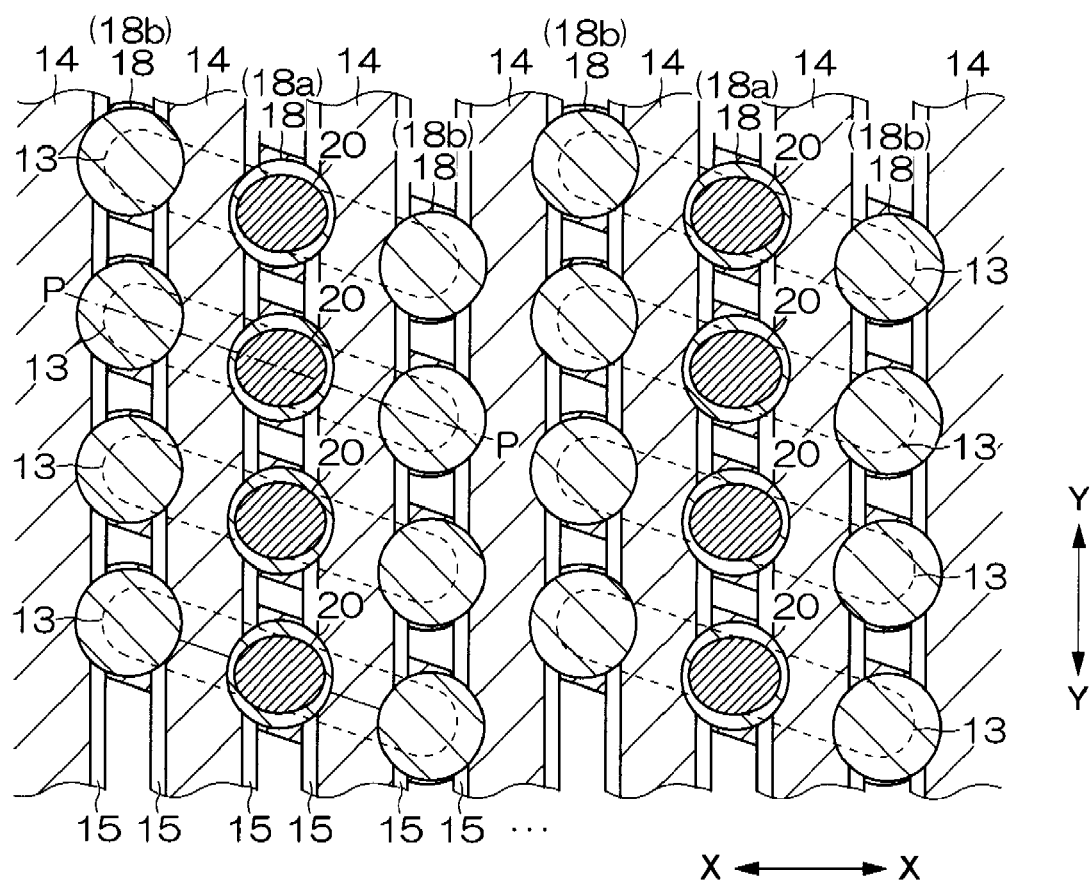
FIG. 5 is a schematic plan view showing the layout in the sequence of the manufacturing process of the DRAM 10 (specifically forming bit line contacts 20) according to a preferred embodiment of the present invention.
Figure 14:
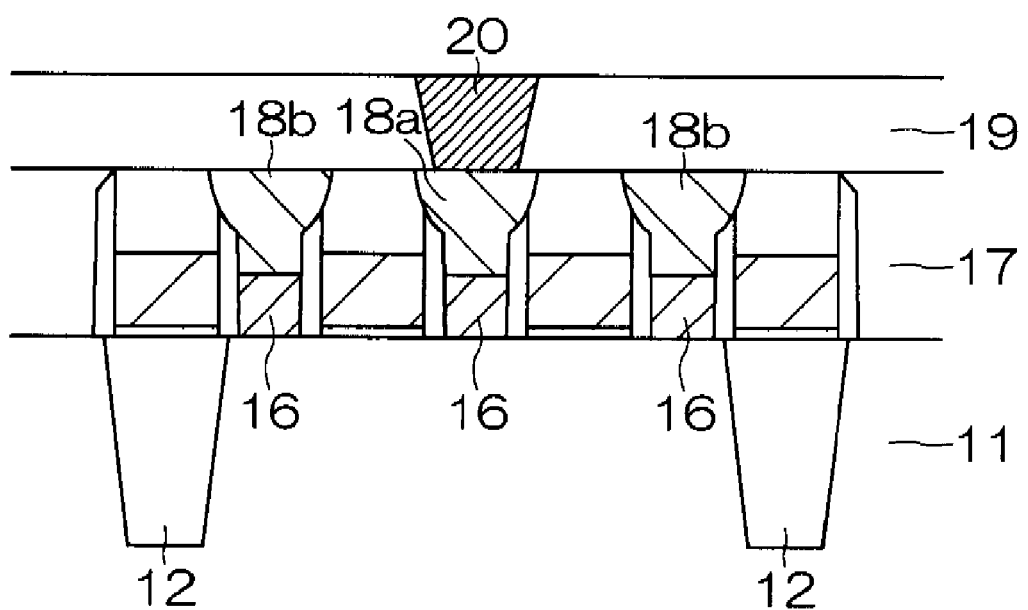
FIG. 14 is a schematic sectional view along line P-P in FIG. 5.

As shown in FIGS. 5 and 14, bit line contacts 20 are formed above the cell contacts (hereinafter referred to as first cell contacts) formed in the center portions of each of the active regions 13. The bit line contacts 20 are formed by a process in which an interlayer insulating film 19 composed of BPSG having a prescribed thickness is formed on the entire surface of the substrate, and contact holes that pass through the interlayer insulating film 19 are formed above the first cell contacts 18a, after which tungsten or another conductive material is filled into the contact holes. The center positions of the bit line contacts 20 coincide with the center positions of the first cell contacts 18a. The contact holes are formed by photolithography and etching using a resist mask. The bit line contacts 20 are formed by a process in which tungsten is deposited on the entire surface of the substrate, including the interior of the contact holes, and the tungsten is then polished by CMP so as to remain only in the interior of the contact holes.

Since the center positions of the bit line contacts 20 coincide herein with the center positions of the first cell contacts 18a, the distance between the centers of two bit line contacts 20, 20 that are adjacent in the Y direction is 2F. The top diameter (diameter) of the bit line contacts 20 is preferably about 120 nm, and the bottom diameter (diameter) is preferably about 93 nm.

Figure 6:
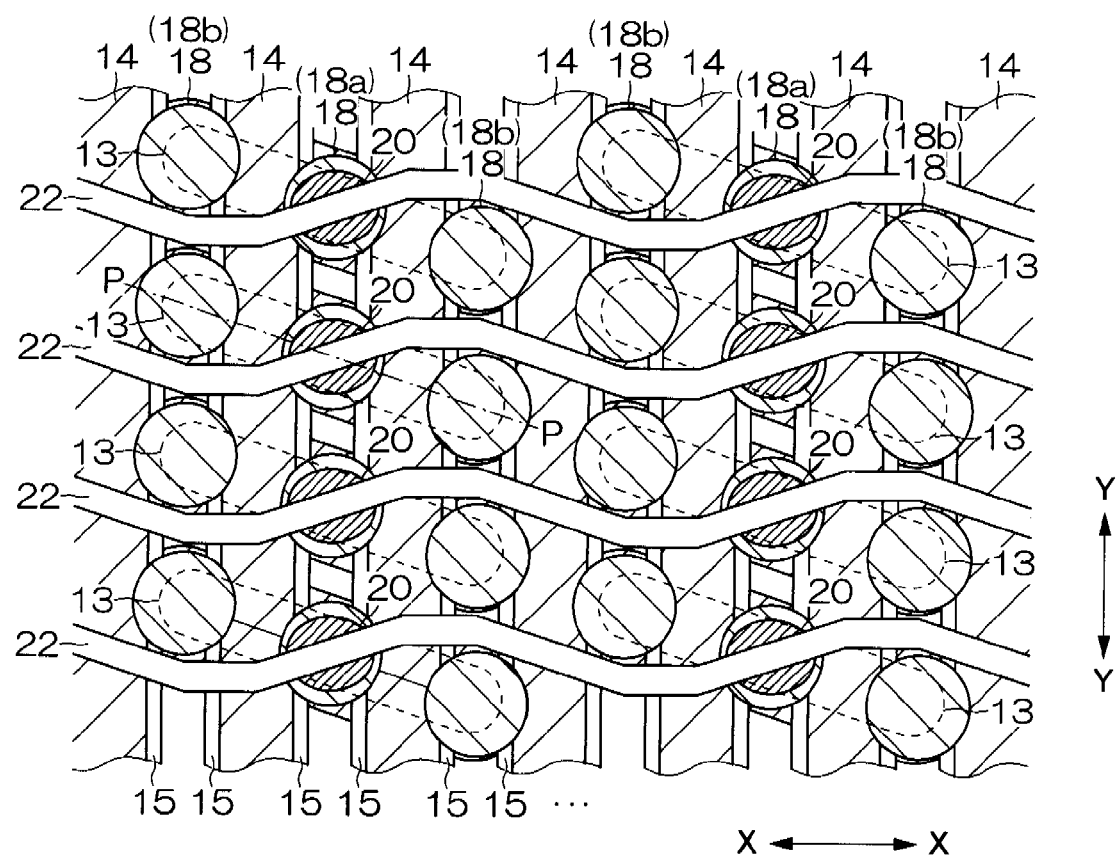
FIG. 6 is a schematic plan view showing the layout in the sequence of the manufacturing process of the DRAM 10 (specifically forming bit lines 22) according to a preferred embodiment of the present invention.
Figure 15:
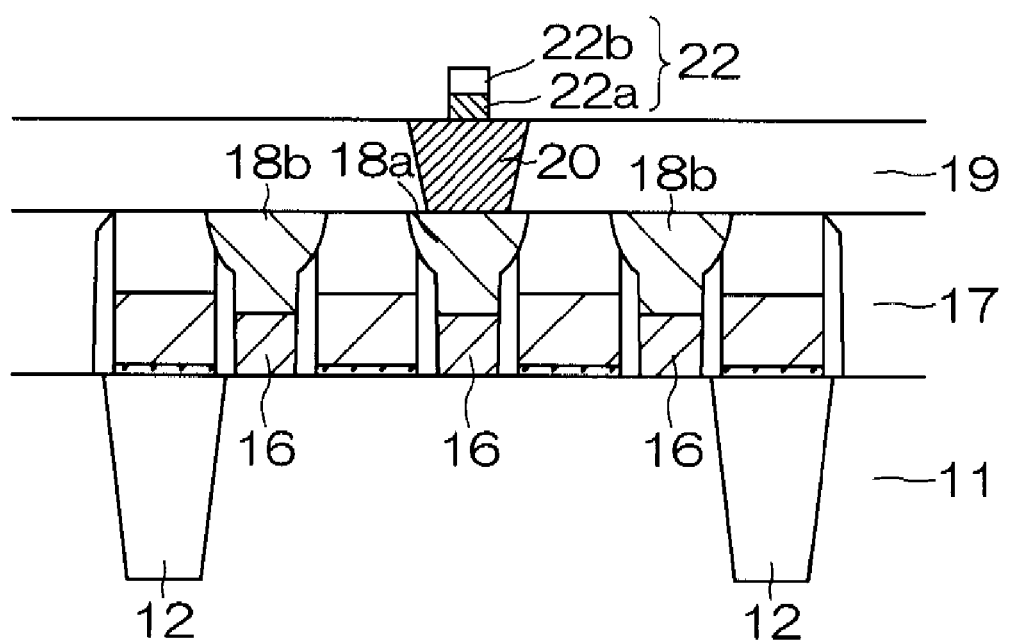
FIG. 15 is a schematic sectional view along line P-P in FIG. 6.

A plurality of bit lines 22 is then wired in the X direction, as shown in FIGS. 6 and 15. The bit lines 22 pass through over the bit line contacts 20, and are wired in meandering fashion so as not to be above the cell contacts (hereinafter referred to as second cell contacts) 18b formed in the portions at both ends of the active regions 13. The bit lines 22 are formed by a process in which a tungsten nitride film 22a and a tungsten film 22b are deposited in sequence on the entire surface of the substrate by sputtering, after which the films are etched using a silicon nitride film or other hard mask. Bit lines 22 having a line width that is adequately smaller than the minimum feature size F can thereby be formed, and a margin of deviation with respect to the bit line contacts 20 can be adequately maintained. The widest distance between bit lines 22 that are adjacent in the Y direction is 2F, and the narrowest distance is 1.9F. The meandering width of the bit lines is set to ⅔F, and the fold angle for meandering is set to approximately 18 degrees, so as to be the same as the tilt of the active regions 13. Accordingly, the bit lines 22 have a portion that extends parallel to the active regions 13.

Figure 7:
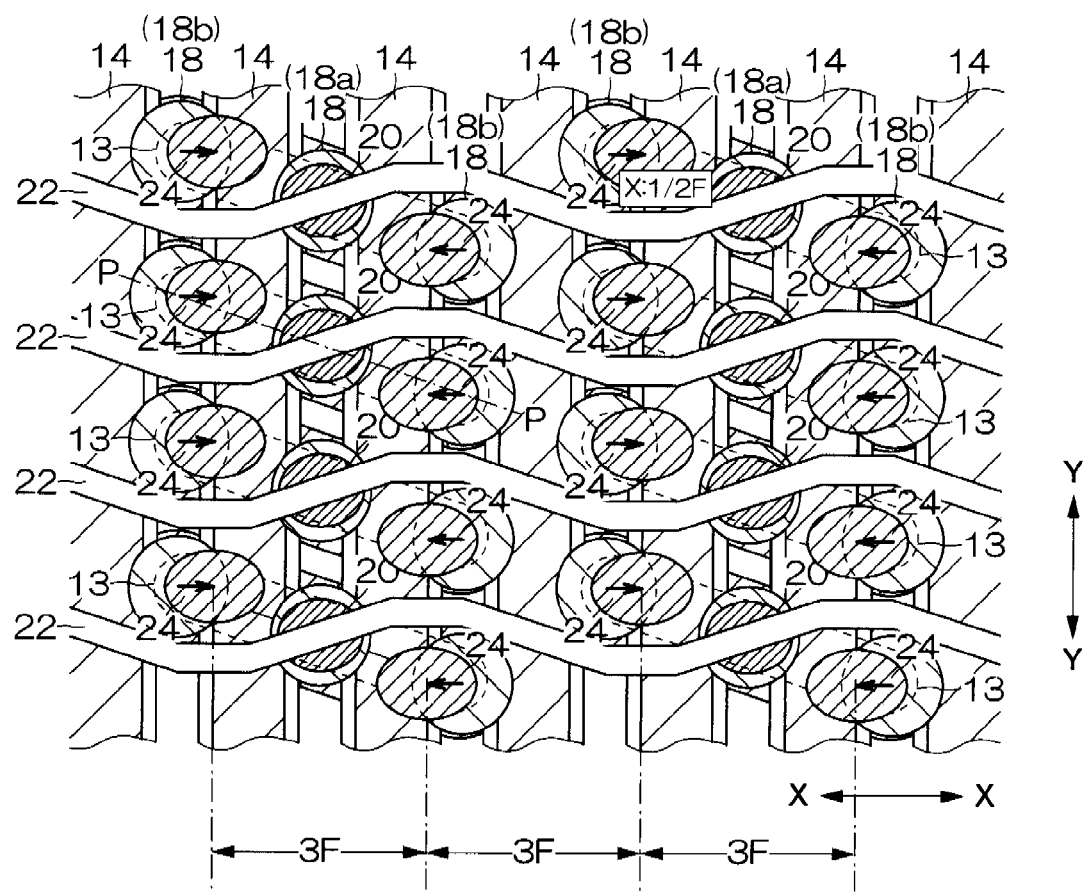
FIG. 7 is a schematic plan view showing the layout in the sequence of the manufacturing process of the DRAM 10 (specifically forming storage node contacts 24) according to a preferred embodiment of the present invention.
Figure 16:
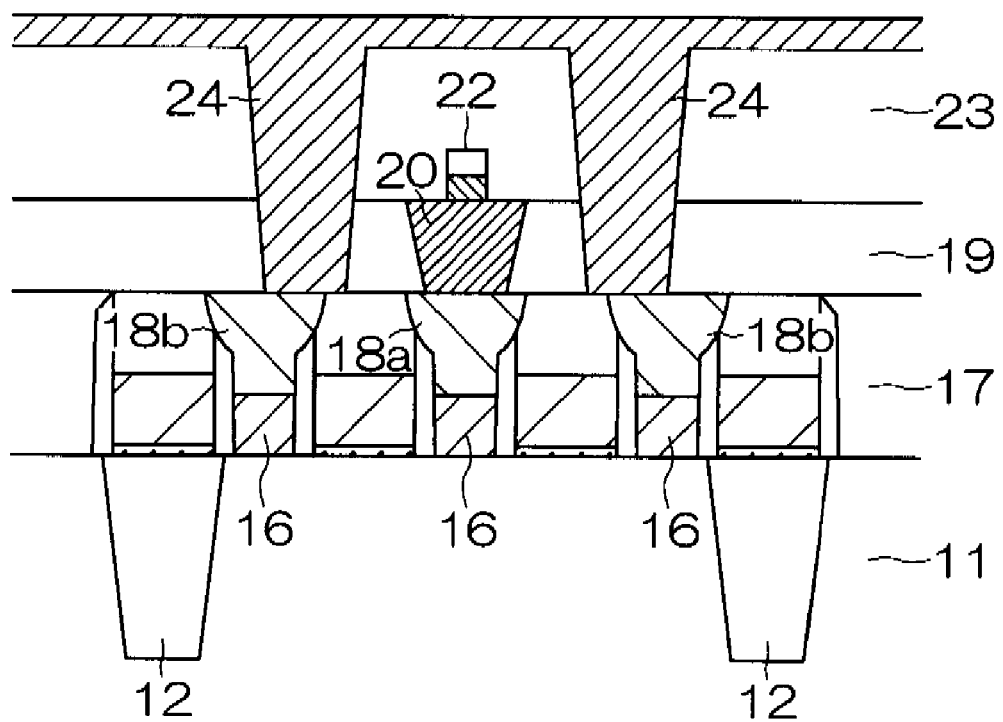
FIG. 16 is a schematic sectional view along line P-P in FIG. 7.

As shown in FIGS. 7 and 16, storage node contacts 24 are formed above the second cell contacts 18b. In the formation of the storage node contacts 24, an interlayer insulating film 23 composed of a silicon oxide film having a prescribed thickness is formed on the entire surface of the substrate, and elliptical contact holes are formed so as to pass through the interlayer insulating film 23 above the second cell contacts 18b. The storage node contacts 24 are then formed by a process in which DOPOS or another conductive material is deposited on the entire surface of the substrate, including the interior of the contact holes, and the conducting material is then polished by CMP so as to remain only in the interior of the contact holes. The center positions of the storage node contacts 24 do not coincide with the center positions of the second cell contacts 18b, but are offset 0.5F in the X direction towards the center portions of the corresponding active regions 13. As a result, the storage node contacts 24 are arranged at equal intervals in the X direction. The distance between the centers of two storage node contacts 24, 24 that are adjacent in the Y direction is 2.0F, and the other distance between the centers of two storage node contacts 24, 24 that are adjacent in the tilted direction is about 3.07F. The minor axis and major axis of the bottom diameter of the storage node contacts 24 are preferably 70 nm and 120 nm, respectively, and the minor axis and major axis of the top diameter are preferably 97 nm and 138 nm, respectively.

Figure 8:
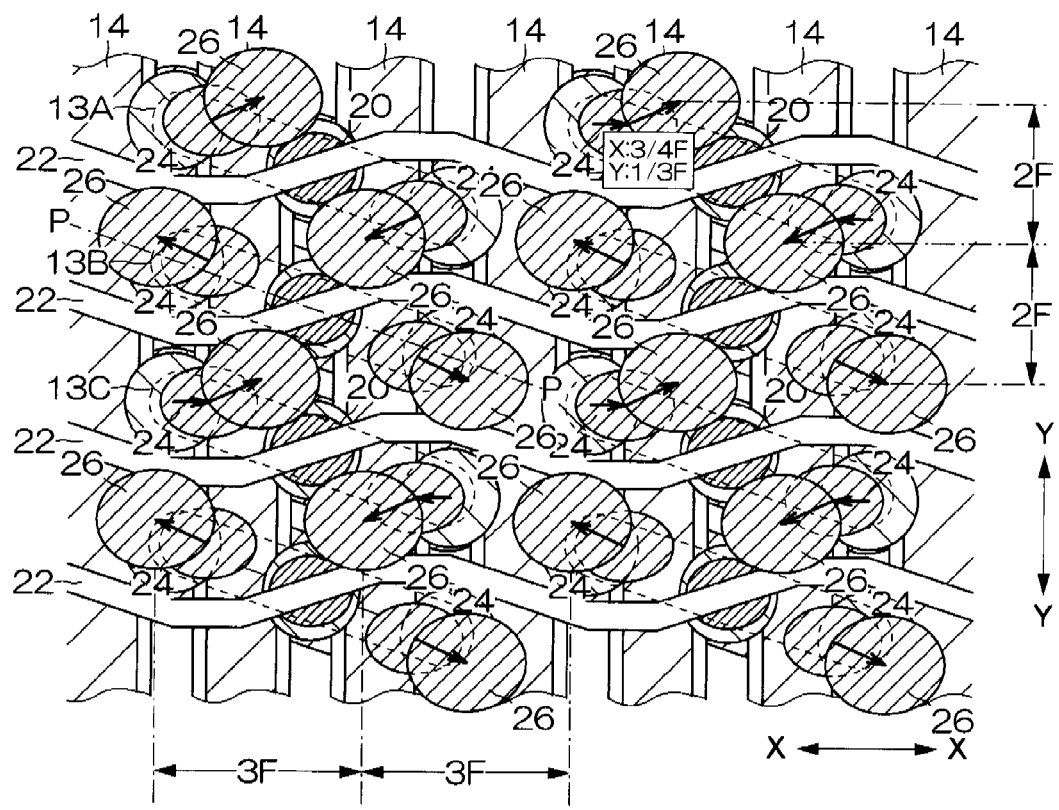
FIG. 8 is a schematic plan view showing the layout in the sequence of the manufacturing process of the DRAM 10 (specifically forming storage node contact pads 26) according to a preferred embodiment of the present invention.
Figure 17:
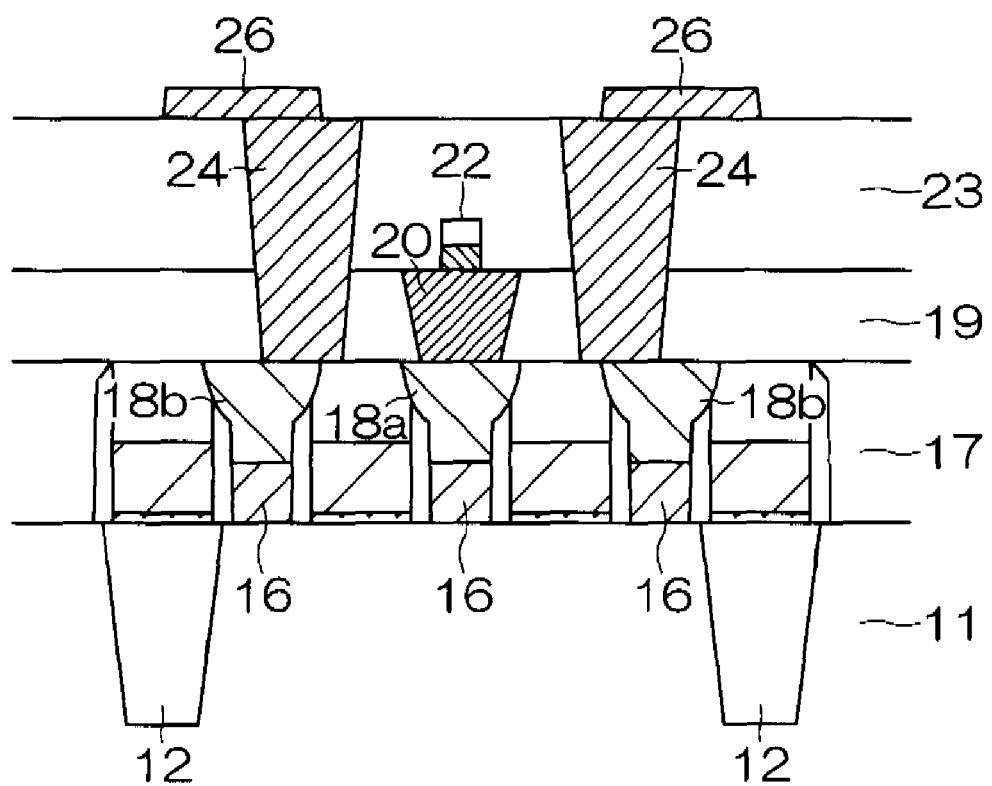
FIG. 17 is a schematic sectional view along line P-P in FIG. 8.

As shown in FIGS. 8 and 17, elliptical storage node contact pads 26 are formed above the storage node contacts 24. The storage node contact pads 26 are formed by depositing DOPOS or another conductive material on the interlayer insulating film 23 and the storage node contacts 24, and then etching the conductive material by using a resist mask. In the stage shown in FIGS. 7 and 16, the storage node contact pads 26 and the storage node contacts 24 may be formed simultaneously by a process in which contact holes that pass through the interlayer insulating film 23 are formed, DOPOS is formed on the entire surface so as to fill the contact holes, and etching is then performed using a resist mask composed of a pattern for the storage node contact pads. The area of the storage node contact pads 26 is wider than the area of the storage node contacts 24, and the lengths of the minor axis and major axis thereof are set to 135 nm and 170 nm, respectively. At this time, the center positions of the storage node contact pads 26 do not coincide with the center positions of the storage node contacts 24, and are offset further to the inside (in the direction that approaches the center portions of the corresponding active regions 13) or further to the outside (in the direction away from the center portions of the corresponding active regions 13) than the center positions of the storage node contacts 24.

The layout of the storage node contact pads 26 is a combination of a first pad layout in which two storage node contact pads 26 that correspond to the same active region are offset (to the inside) in the direction that approaches the center portions of the active regions 13, and a second pad layout in which two storage node contact pads 26 that correspond to the same active region are offset (to the outside) in the direction away from the center portions of the active regions 13. The first pad layout and the second pad layout are employed in alternating fashion for the plurality of active regions arranged in the Y direction. For example, in the first, second, and third active regions 13A through 13C in FIG. 8 that are continuous in the Y direction, the storage node contact pads 26, 26 based on the first active region 13A have the first pad layout that is offset to the inside; the storage node contact pads 26, 26 based on the second active region 13B have the second pad layout that is offset to the outside; and the storage node contact pads 26, 26 based on the third active region 13C have the first pad layout that is offset to the inside.

In the first and second pad layouts described above, the center positions of the storage node contact pads 26 are offset in a tilted direction. In other words, the offset direction has both an X direction component and a Y direction component. In the case of the first pad layout, the center positions of the storage node contact pads 26 are offset ¾F in the direction that approaches the center portions of the corresponding active regions with respect to the X direction, and are offset ⅓F in the direction away from the center portions of the corresponding active regions 13 with respect to the Y direction. In the case of the second pad layout, the center positions of the storage node contact pads 26 are offset ¾F in the direction away from the center portions of the corresponding active regions 13 with respect to the X direction, and are offset ⅓F in the direction away from the center portions of the corresponding active regions 13 with respect to the Y direction. The distance between the centers of two storage node contact pads 26 that are adjacent in the X direction is thereby set to 3F, and the interval at which the storage node contact pads 26 are arranged in the Y direction is set to 2F. At this time, the distance between the centers of two storage node contact pads 26 that are adjacent in the tilted direction is 2.5F.

FIGS. 19 through 22 are schematic plan views showing details of the layout shown in FIG. 8.

Figure 19:
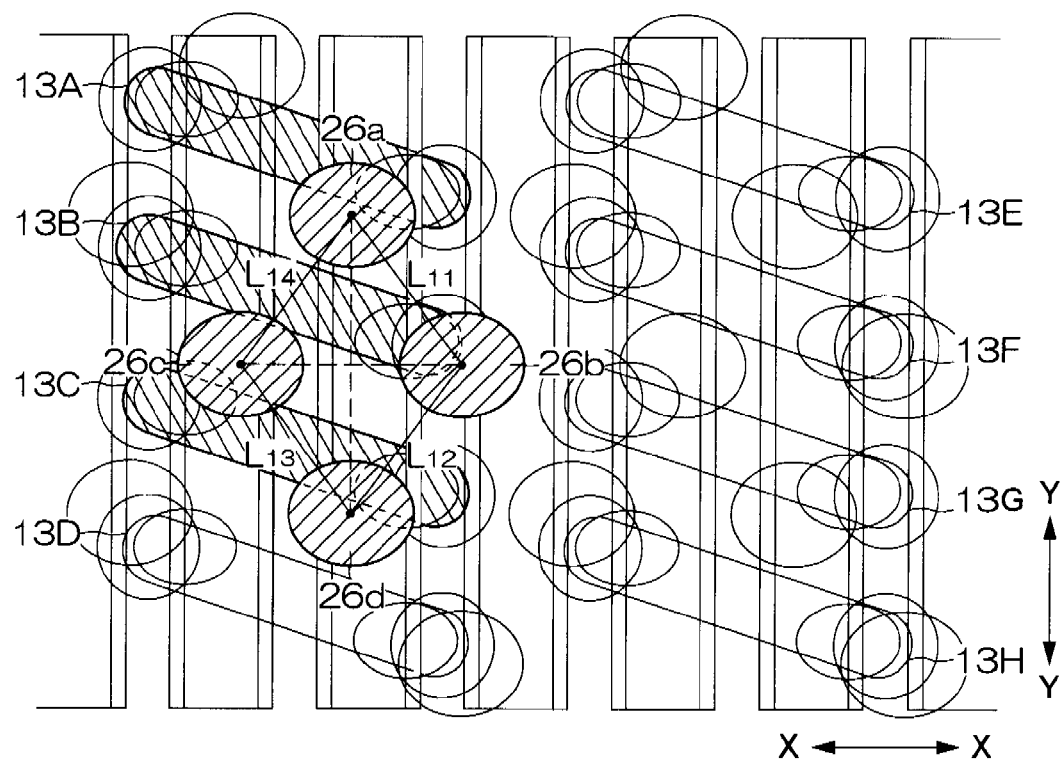
FIG. 19 is a schematic plan view showing details of the layout shown in FIG. 8.

As shown in FIG. 19, in the active regions 13A through 13C that are continuous in the Y direction, the positional relationship between the first storage node contact pad 26a formed at one end portion of the active region 13A and the second storage node contact pad 26b formed at one end of the active region 13B is equivalent to the positional relationship between the third and fourth storage node contact pads 26c and 26d formed at the respective end portions of the active region 13C. The positional relationship between the first storage node contact pad 26a and the third storage node contact pad 26c is also equivalent to the positional relationship between the second storage node contact pad 26b and the fourth storage node contact pad 26d. Specifically, the distance $L_{11}$ between the center positions of the first and second storage node contact pads 26a, 26b; the distance $L_{12}$ between the center positions of the second and fourth storage node contact pads 26b, 26d; the distance $L_{13}$ between the center positions of the fourth and third storage node contact pads 26d, 26c; and the distance $L_{14}$ between the center positions of the third and first storage node contact pads 26c, 26a are all set so as to be equal, and the line that continuously connects these center position points forms a diamond shape. From another perspective, the line segment that connects the center position of the second storage node contact pad 26b and the center position of the third storage node contact pad 26c in the X direction, and the line segment that connects the center position of the first storage node contact pad 26a and the center position of the fourth storage node contact pad 26d in the Y direction are orthogonal to each other, and one line segment passes through the center point of the other line segment.

Figure 20:
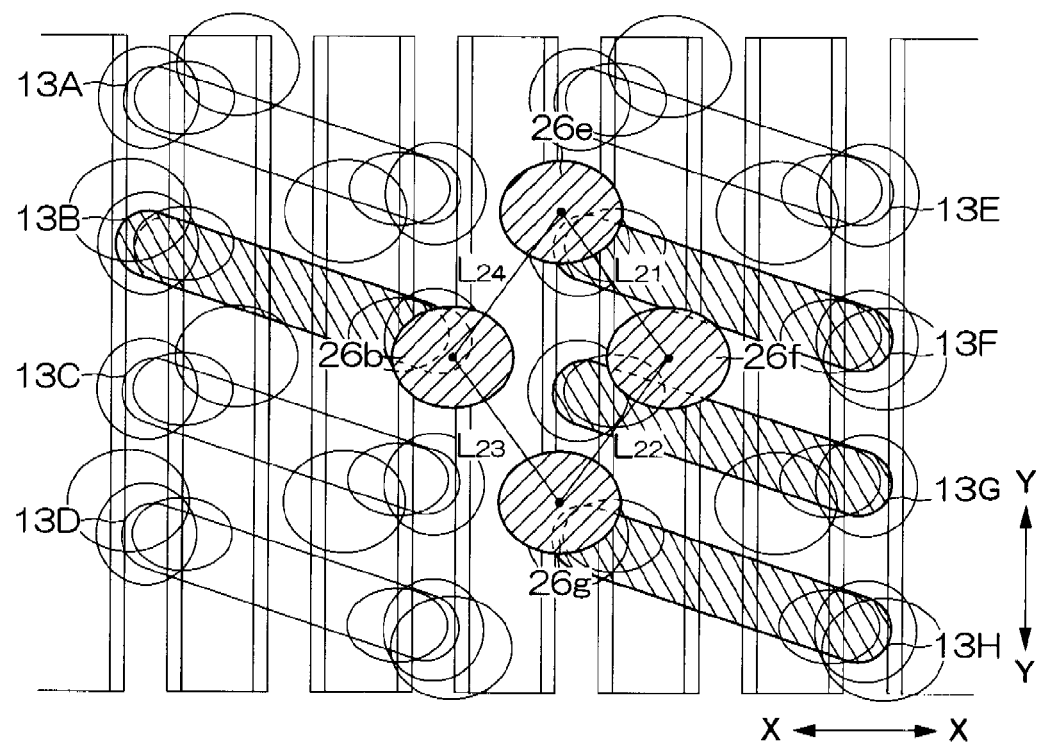
FIG. 20 is a schematic plan view showing details of the layout shown in FIG. 8.

As shown in FIG. 20, in the active regions 13F through 13H that are continuous in the Y direction, and in the active region 13B that is adjacent in the longitudinal direction to the active region 13G, the positional relationship between the first storage node contact pad 26e formed at one end of the active region 13F, and the second storage node contact pad 26f formed at one end of the active region 13G is equivalent to the positional relationship between the third storage node contact pad 26b formed at one end of the active region 13B, and the fourth storage node contact pad 26g formed at one end of the active region 13H. The positional relationship between the first storage node contact pad 26e and the third storage node contact pad 26b is also equivalent to the positional relationship between the second storage node contact pad 26f and the fourth storage node contact pad 26g. Specifically, the distance $L_{21}$ between the center positions of the first and second storage node contact pads 26e, 26f; the distance $L_{22}$ between the center positions of the second and fourth storage node contact pads 26f, 26g; the distance $L_{23}$ between the center positions of the fourth and third storage node contact pads 26g, 26b; and the distance $L_{24}$ between the center positions of the third and first storage node contact pads 26b, 26e are all set so as to be equal, and the line that continuously connects these center position points forms the same diamond shape as the one shown in FIG. 19. From another perspective, the line segment that connects the center position of the second storage node contact pad 26b and the center position of the third storage node contact pad 26f in the X direction, and the line segment that connects the center position of the first storage node contact pad 26e and the center position of the fourth storage node contact pad 26g in the Y direction are orthogonal to each other, and one line segment passes through the center point of the other line segment.

Figure 21:
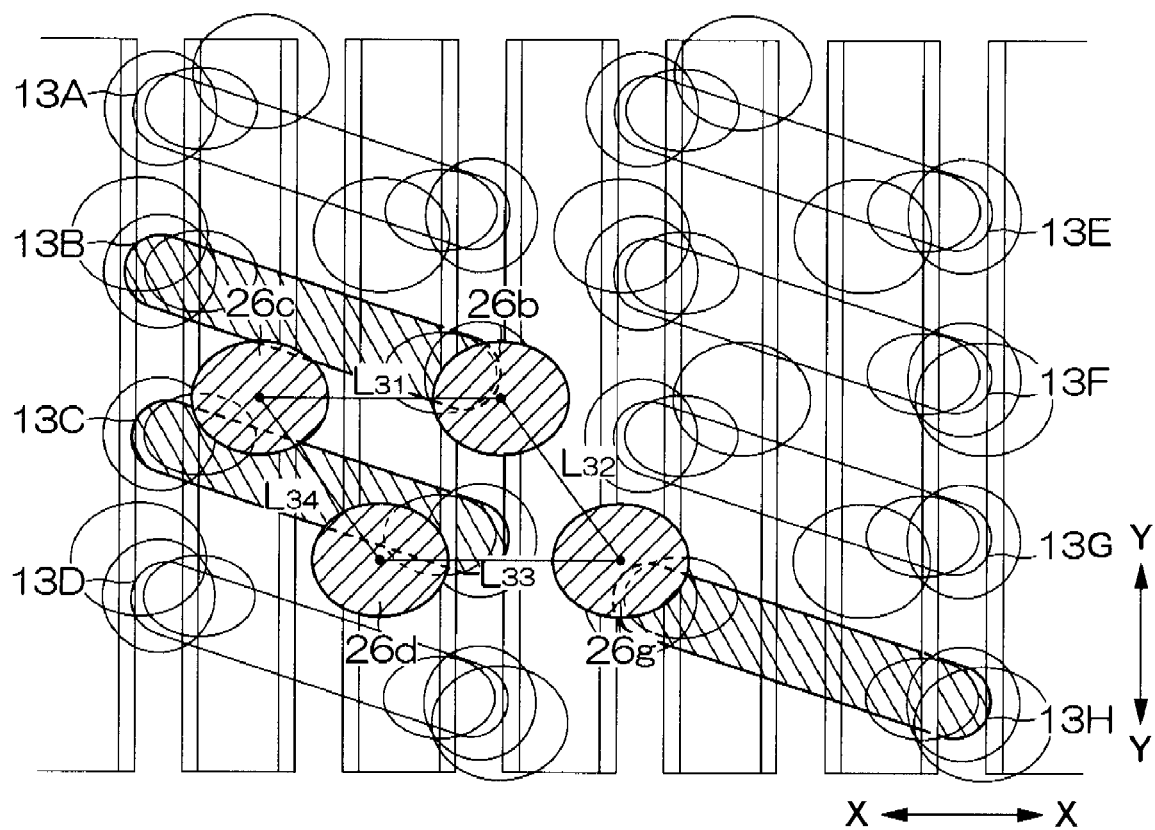
FIG. 21 is a schematic plan view showing details of the layout shown in FIG. 8.

As shown in FIG. 21, in the active regions 13B and 13C that are continuous in the Y direction, and in the active region 13H that is adjacent in the longitudinal direction to the active region 13C, the positional relationship between the first storage node contact pad 26c formed at one end of the active region 13C, and the second storage node contact pad 26d formed at the other end of the active region 13C is equivalent to the positional relationship between the third storage node contact pad 26b formed at one end of the active region 13B, and the fourth storage node contact pad 26g formed at one end of the active region 13H. The positional relationship between the first storage node contact pad 26c and the third storage node contact pad 26b is also equivalent to the positional relationship between the second storage node contact pad 26d and the fourth storage node contact pad 26g. Specifically, the distance $L_{34}$ between the center positions of the first and second storage node contact pads 26c, 26d, and the distance $L_{32}$ between the center positions of the third and fourth storage node contact pads 26b, 26g are set so as to be equal; and the distance $L_{31}$ between the center positions of the first and third storage node contact pads 26c, 26b, and the distance $L_{33}$ between the center positions of the second and fourth storage node contact pads 26d, 26g are set so as to be equal. The line that continuously connects these center position points forms a parallelogram shape.

Figure 22:
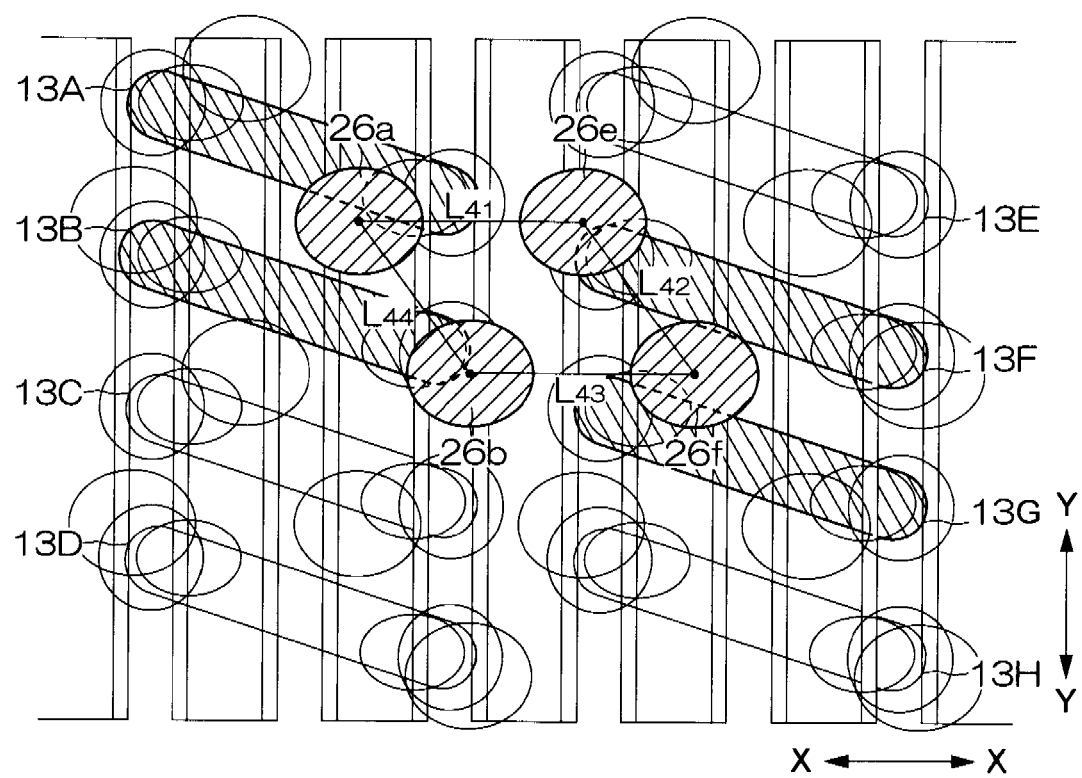
FIG. 22 is a schematic plan view showing details of the layout shown in FIG. 8.
Figure 23A:
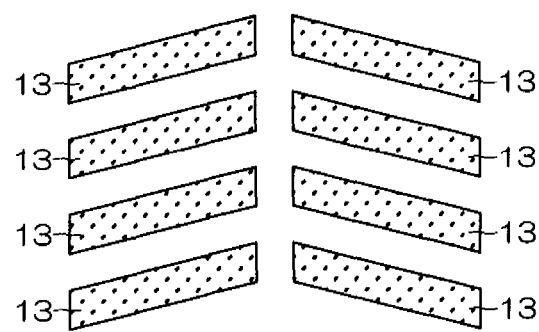
FIG. 23A is a schematic plan view showing an example of the layout of conventional DRAM having a cell area of $6F^2$.
Figure 23B:
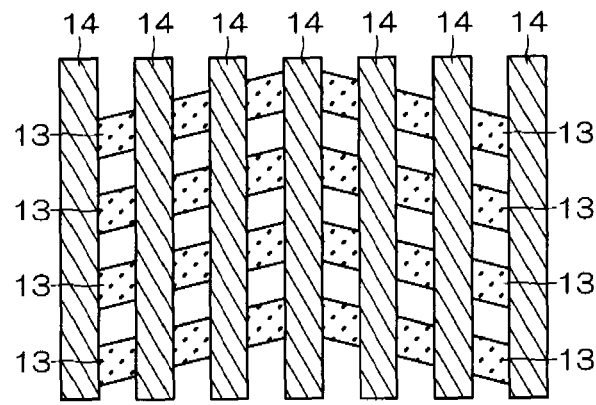
FIG. 23B is a schematic plan view showing an example of the layout of conventional DRAM having a cell area of $6F^2$.
Figure 23C:
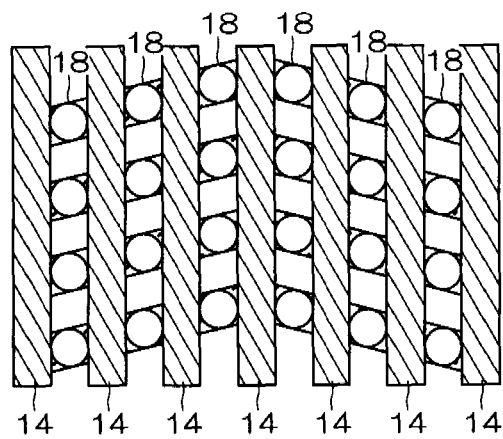
FIG. 23C is a schematic plan view showing an example of the layout of conventional DRAM having a cell area of $6F^2$.
Figure 23D:
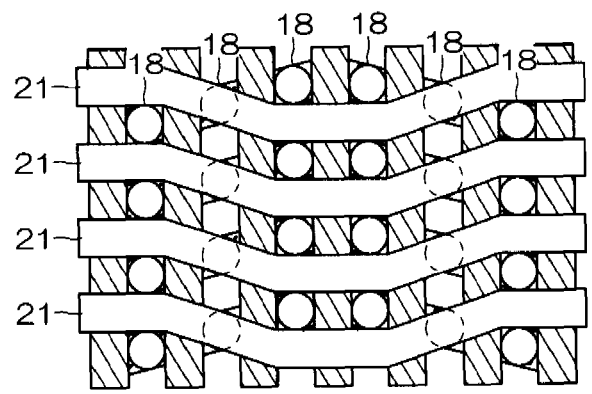
FIG. 23D is a schematic plan view showing an example of the layout of conventional DRAM having a cell area of $6F^2$.
Figure 23E:
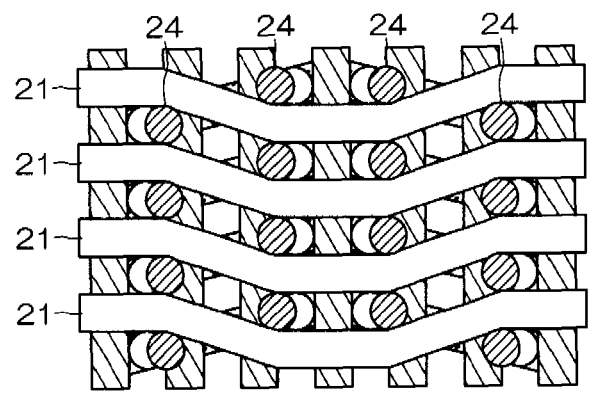
FIG. 23E is a schematic plan view showing an example of the layout of conventional DRAM having a cell area of $6F^2$.
Figure 23F:
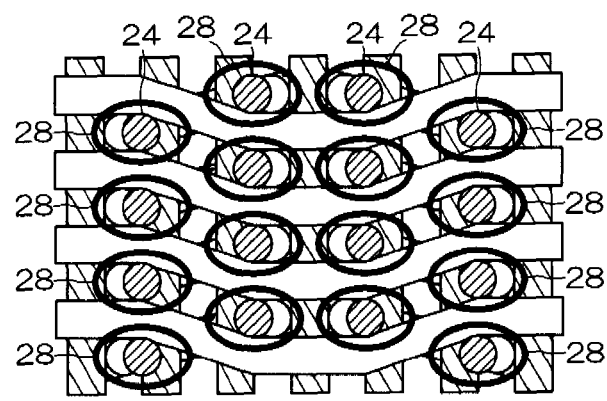
FIG. 23F is a schematic plan view showing an example of the layout of conventional DRAM having a cell area of $6F^2$.

As shown in FIG. 22, in the active regions 13A and 13B that are continuous in the Y direction, in the active region 13F that is adjacent in the longitudinal direction to the active region 13A, and in the active region 13G that is adjacent in the Y direction to the active region 13F and adjacent in the longitudinal direction to the active region 13B, the positional relationship between the first storage node contact pad 26a formed at one end of the active region 13A, and the second storage node contact pad 26b formed at one end of the active region 13B is equivalent to the positional relationship between the third storage node contact pad 26e formed at one end of the active region 13F, and the fourth storage node contact pad 26f formed at one end of the active region 13G. The positional relationship between the first storage node contact pad 26a and the third storage node contact pad 26e is also equivalent to the positional relationship between the second storage node contact pad 26b and the fourth storage node contact pad 26f. Specifically, the distance $L_{44}$ between the center positions of the first and second storage node contact pads 26a, 26d, and the distance $L_{42}$ between the center positions of the third and fourth storage node contact pads 26e, 26g are set so as to be equal; and the distance $L_{41}$ between the center positions of the first and third storage node contact pads 26a, 26e, and the distance $L_{43}$ between the center positions of the second and fourth storage node contact pads 26b, 26f are set so as to be equal. The line that continuously connects these center position points forms the same parallelogram shape as the one shown in FIG. 21.

When the storage node contact pads 26 are laid out as described above, the storage node contact pads 26 are in a zigzag pattern that is uniform over the entire surface of the substrate.

Figure 9:
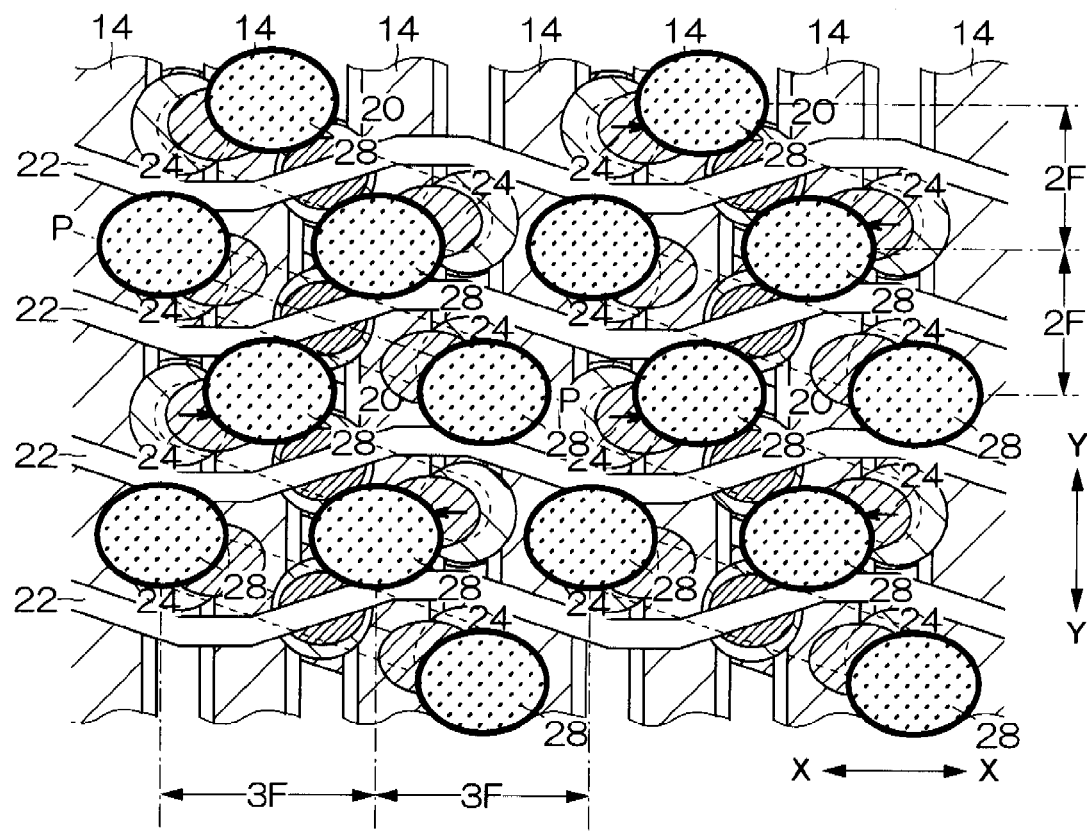
FIG. 9 is a schematic plan view showing the layout in the sequence of the manufacturing process of the DRAM 10 (specifically forming storage capacitors 28) according to a preferred embodiment of the present invention.
Figure 18:
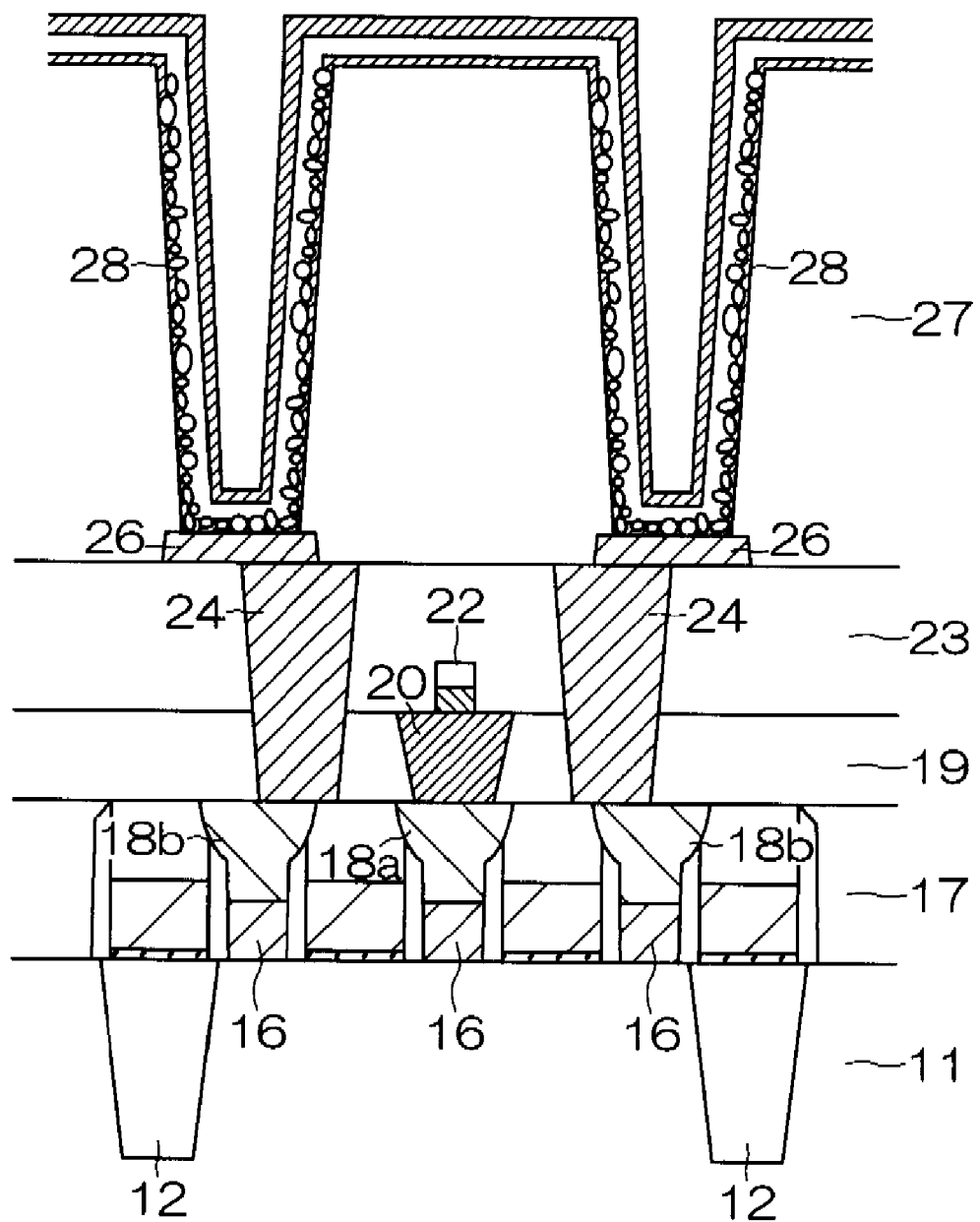
FIG. 18 is a schematic sectional view along line P-P in FIG. 9.

Storage capacitors 28 are then formed above the storage node contact pads 26, as shown in FIGS. 9 and 18. The storage capacitors 28 are formed by a process in which an interlayer insulating film 27 is formed on the entire surface of the substrate, and cylinder holes that pass through the interlayer insulating film 27 are formed above the storage node contact pads 26, after which a lower electrode, a capacitor insulating film, and an upper electrode are deposited in sequence in the cylinder holes. In the present embodiment, the lower electrodes in the storage capacitors 28 are preferably composed of HSG-Si. The use of HSG-Si enables a significant enhancement of refresh characteristics due to increased surface area of the electrode. Since the center positions of the storage capacitors 28 coincide with the center positions of the storage node contact pads 26, the distance between the centers of two storage capacitors 28 (and storage node contact pads 26) that are adjacent in the X direction is 3.0F, and the other distance between the centers of two cylinder-type storage capacitors 28, that are adjacent in the tilted direction is 2.5F. The minor axis and major axis of the bottom diameter of the cylinder holes are preferably 86 nm and 124 nm, respectively, and the minor axis and major axis of the top diameter are preferably 143 nm and 181 nm, respectively.

According to the present embodiment as described above, arrangement of the storage capacitors at maximum density is made possible by offsetting the center positions of the storage node contacts from the center positions of the cell contacts to create an equally spaced zigzag layout of the storage node contacts, and then also offsetting the center positions of the storage node contact pads from the center positions of the storage node contacts to create an equally spaced zigzag layout of the storage node contact pads. Further, since the pitch of the storage node capacitors in the miner axis is longer than the conventional layout, it is possible to increase the capacity of the storage capacitor and enlarge the HSG blockage margin.

Preferred embodiment of the present invention has been explained above, but the present invention is not limited thereto. A variety of modifications are possible within the scope of the main points of the present invention, and it shall be apparent that these modifications are also included within the scope of the present invention.

For example, the storage capacitors 28 were cylindrical in the abovementioned embodiment, but the shape of the storage capacitors is not limited to a cylindrical shape, and may be a columnar shape, a crown shape, or other shape.

The bit lines 21 were also formed by etching using a silicon nitride film or other hard mask in the abovementioned embodiment, but bit lines 21 that have an adequately small trench width can be formed using a damascene process or other ultrafine machining technique.

An example of an MIS capacitor that used HSG-Si in the lower electrode was described in the above-mentioned embodiment, but the present invention may also be applied to a MIM (Metal Insulator Metal) capacitor. In the case of an MIM capacitor, an even greater capacity than that of an MIS capacitor that uses HSG-Si can be obtained by forming the lower electrode by a CVD method using titanium nitride or another metal material, and forming an insulating film by an ALD method using aluminum oxide or hafnium oxide. The lower electrode formed from titanium nitride or the like may be formed at the same time as the storage node contacts and storage node contact pads, and storage node contact pads composed of titanium nitride may be formed after the storage node contacts are formed by embedding of silicon. However, in any case, titanium silicide must be formed in the interface between the titanium nitride and the silicon under the titanium nitride.

What is claimed is:

1. A semiconductor device comprising:
an active region including a first region, a first channel region and a second region that are arranged in line in a first direction, the first channel region being sandwiched between the first and second regions;
a first word line elongated in a second direction to cross the first channel region of the active region, the second direction being different from the first direction;
a bit line elongated in a third direction to cross the second region of the active region, the third direction being different from each of the first and second directions;
a bit line contact intervening between the second region of the active region and the bit line to form an electrical contact therebetween;
a first cell contact formed in contact with the first region of the active region;
a first storage node contact formed in contact with a part of the first cell contact, a center of the first storage node contact being out of vertical alignment with a center of the first cell contact;
a first storage node contact pad formed in contact with a part of the first storage node contact pad being out of vertical alignment with the center of the first storage node contact; and
a first capacitor formed in contact with the first storage node contact pad,
wherein the active region further includes a second channel region and a third region that are arranged in line in the first direction, the second channel region being sandwiched between the second and third regions, and the device further comprises:
a second word line elongated in the second direction to cross the second channel region of the active region;
a second cell contact formed in contact with the third region of the active region;
a second storage node contact formed in contact with a part of the second cell contact, a center of the second storage node contact being out of vertical alignment with a center of the second cell contact;
a second storage node contact pad formed in contact with a part of the second storage node contact; and
a second capacitor formed in contact with the second storage node contact pad.

2. The device as claimed in claim 1, wherein the center of the first storage node contact is vertically deviated from the center of the first cell contact in a fourth direction and the center of the second storage node contact is vertically deviated from the center of the second cell contact in a fifth direction that is different from the fourth direction.

3. The device as claimed in claim 2, wherein the fourth direction is substantially opposite to the fifth direction.

4. The device as claimed in claim 1, wherein a center of the second storage node contact pad is out of vertical alignment with the center of the second storage node contact.

5. The device as claimed in claim 1, further comprising a third cell contact formed between the second region of the active region and the bit line contact, a center of the third cell contact is substantially vertically aligned with a center of the bit line contact.

6. A semiconductor device comprising:
an active region including a first region, a first channel region and a second region that are arranged in line in a first direction, the first channel region being sandwiched between the first and second regions;
a first word line running in a second direction to cross the first channel region of the active region, the second direction being different from the first direction;
a first insulating film covering the active region and the first word line, the first insulating film including first and second holes that expose a part of the first region and a part of the second region, respectively;
first and second cell contacts formed in contact with the part of the first region and the part of the second region through the first hole and the second hole of the first insulating film, respectively;
a bit line formed over the first insulating film and running in a third direction with electrical connection to the second cell contact, the third direction being different from each of the first and second directions;
a second insulating film covering the first insulating film, the first and second cell contacts and the bit line, the second insulating film including a third hole that exposes a part of the first cell contact and a part of the first insulating film;
a first storage node contact formed in contact with the respective parts of the first cell contact and the first insulating film through the third hole of the second insulating film;
a first storage node contact pad formed in contact with a part of the first storage node contact, the first storage node contact pad being elongated from the part of the first storage node contact over the second insulating film to produce an elongated portion; and
a first capacitor formed with electrical connection to the first storage node contact pad,
wherein the active region further incudes a second channel region and a third region that arranged in the first direction, the second channel region being sandwiched between the second and third regions,
wherein the first insulating film further includes a fourth hole that exposes a part of third region;
wherein the device further comprises:
a second word line running in the second direction to cross the second channel region of the active region,
a third cell contact formed in contact with the part of the third region through the fourth hole,
a second storage node contact,
a second storage node contact pad formed in contact with the second storage node contact, the second storage node contact pad being elongated form the second storage node contact over the second insulating film to produce an elongated portion, and
a second capacitor formed with electrical connection to the second storage node contact pad;
wherein the second insulating film further includes a fifth hole that exposes a part of the third cell contact and another part of the first insulating film; and
wherein the second storage node contact is formed in contact with the respective parts of the third cell contact and the first insulating film through the fifth hole of the second insulating film.

7. The device as claimed in claim 6, wherein the first capacitor is formed in contact with the elongated portion of the first storage node contact pad.

8. The device as claimed in claim 6, wherein the second capacitor is formed in contact with the elongated portion of the second storage node contact pad.

9. The device as claimed in claim 6, wherein the second insulating film includes first and second insulation layers, the first insulation layer intervening between the first insulating film and the second insulation layer, the bit line being formed between the first and second insulation layers, the first insulation layer including a fourth hole that exposes a part of the second cell contact, and the device further comprising a bit line contact formed in contact with the part of the second cell contact through the fourth hole of the first insulation layer to intervene between the second cell contact and the bit line.

10. A semiconductor device comprising:
a plurality of active regions each formed in a band shape and slanted with respect to each of X and Y directions, each of the active regions including first and second regions and a first channel region between the first and second regions;
a plurality of first word lines each elongated in the X direction to intersect the first channel region of an associated one of the active regions;
a plurality of bit lines each elongated in the Y direction to intersect the first region of an associated one of the active regions;
a plurality of first cell contacts each formed in contact with the first region of an associated one of the active regions;
a plurality of second cell contacts each formed in contact with the second region of an associated one of the active regions;
a plurality of bit line contacts each intervening between an associated one of the first cell contacts and an associated one of the bit lines;
a plurality of first storage node contacts each formed in contact with an associated one of the second cell contacts with an offset in center position from the associated one of the second cell contacts;
a plurality of first storage node contact pads each formed in contact with an associated one of the first storage node contacts with an offset in center position from the associated one of the first storage node contacts; and
a plurality of first capacitors each formed in contact with an associated one of the first storage node contact pads.

11. The device as claimed in claim 10, wherein the first storage node contacts are divided into first and second groups, each of the first storage node contacts belonging to the first group being formed with an offset in center position from the associated one of the second cell contacts in a predetermined direction, and each of the first storage node contacts belonging to the second group being formed with an offset in center position from the associated one of the second cell contacts in an opposite direction to the predetermined direction.

12. The device as claimed in claim 11, wherein the first storage node contacts belonging to the first group and the first storage node contacts belonging to the second group are disposed alternately.

13. The device as claimed in claim 10, wherein the first storage node contact pads are divided into first and second groups, each of the first storage node contact pads belonging to the first group being formed with an offset in center position from the associated one of the first storage node contacts in a predetermined direction, and each of the first storage node contact pads belonging to the second group being formed with an offset in center position from the associated one of the first storage node contacts in an opposite direction to the predetermined direction.

14. The device as claimed in claim 13, wherein the first storage node contact pads belonging to the first group and the first storage node contact pads belonging to the second group are disposed alternately.

15. The device as claimed in claim 10, wherein each of the active regions further includes a third region and a second channel region between the first and third regions, and the device further comprises:
a plurality of second word lines each elongated in the X direction to intersect the second channel region of an associated one of the active regions;
a plurality of third cell contacts each formed in contact with the third region of an associated one of the active regions;
a plurality of second storage node contacts each formed in contact with an associated one of the third cell contacts with an offset in center position from the associated one of the third cell contacts;
a plurality of second storage node contact pads each formed in contact with an associated one of the second storage node contacts; and
a plurality of second capacitors each formed in contact with an associated one of the second storage node contact pads.

16. The device as claimed in claim 15, wherein each of the first storage node contacts is formed with an offset in center position from the associated one of the second cell contacts in a predetermined direction, and each of the second storage node contacts is formed with an offset in center position from the associated one of the third cell contacts in an opposite direction to the predetermined direction.

17. The device as claimed in claim 15, wherein each of the first capacitors is formed in contact with an associated one of the first storage node contact pads with an offset in center position from the associated one of the first storage node contacts in a predetermined direction, and each of the second capacitors is formed in contact with an associated one of the second storage node contact pads with an offset in center position from the associated one of the second storage node contacts in an opposite direction to the predetermined direction.

18. A semiconductor device comprising:
a plurality of active regions disposed in both X and Y directions that are substantially perpendicular to each other, each of the active regions being formed in a band shape and slanted with respect to each of the X and Y directions, each of the active regions including first and second regions and a first channel region between the first and second regions;
a plurality of first word lines each elongated in the X direction to intersect the first channel region of an associated one of the active regions;
a plurality of bit lines each elongated in the Y direction to intersect the first region of an associated one of the active regions;
a plurality of first contacts each intervening between the first region of an associated one of the active regions and an associated one of the bit lines to form an electrical connection therebetween;
a plurality of second contacts each formed in contact with the second region of an associated one of the active regions;
a plurality of third contacts each formed in contact with an associated one of the second contacts with an offset in center position from the associated one of the second contacts; and a plurality of first capacitors each formed with an electrical connection with an associated one of the third contacts.

19. The device as claimed in claim 18, wherein the third contacts are divided into first and second groups, each of the third contacts belonging to the first group being formed with an offset in center position from the associated one of the second contacts In a predetermined direction, and each of the third contacts belonging to the second group being formed with an offset in center position from the associated one of the second contacts in an opposite direction to the predetermined direction.

20. The device as claimed in claim 19, wherein the third contacts belonging to the first group and the third contacts belonging to the second group are disposed alternately.

21. The device as claimed in claim 18, wherein each of the active regions further includes a third region and a second channel region between the first and third regions, and the device further comprises:

a plurality of second word lines each elongated in the X direction to intersect the second channel region of an associated one of the active regions;

a plurality of fourth contacts each formed in contact with the third region of an associated one of the active regions;

a plurality of fifth contacts each formed in contact with an associated one of the fourth contacts with an offset in center position from the associated one of the fourth contacts; and a plurality of second capacitors each formed with an electrical connection with an associated one of the fifth contacts.

22. The device as claimed in claim 21, wherein each of the third contacts is formed with an offset in center position from the associated one of the second contacts in a predetermined direction, and each of the fifth contacts is formed with an offset in center position from the associated one of the fourth contacts in an opposite direction to the predetermined direction.

* * * * *